(12) United States Patent
MacDonald et al.

(10) Patent No.: US 9,367,101 B2
(45) Date of Patent: Jun. 14, 2016

(54) PASSIVE NOISE CANCELLATION FOR COMPUTER COOLING SYSTEMS

(75) Inventors: Mark MacDonald, Beaverton, OR (US); Anthony Gerard, Québec (CA)

(73) Assignee: Intel Corporation, Santa Clara, CA (US)

( * ) Notice: Subject to any disclaimer, the term of this patent is extended or adjusted under 35 U.S.C. 154(b) by 174 days.

(21) Appl. No.: 13/997,052

(22) PCT Filed: Mar. 14, 2012

(86) PCT No.: PCT/US2012/029139
§ 371 (c)(1),
(2), (4) Date: Jun. 21, 2013

(87) PCT Pub. No.: WO2013/137876
PCT Pub. Date: Sep. 19, 2013

(65) Prior Publication Data
US 2013/0342992 A1 Dec. 26, 2013

(51) Int. Cl.
*H05K 7/20* (2006.01)
*G06F 1/20* (2006.01)
*H01L 23/427* (2006.01)
*H01L 23/467* (2006.01)
*F04D 25/06* (2006.01)
*F04D 29/52* (2006.01)
*F04D 29/66* (2006.01)
*H01L 21/48* (2006.01)

(52) U.S. Cl.
CPC .............. *G06F 1/20* (2013.01); *F04D 25/0613* (2013.01); *F04D 29/522* (2013.01); *F04D 29/667* (2013.01); *H01L 23/427* (2013.01); *H01L 23/467* (2013.01); *H01L 21/4882* (2013.01); *H01L 2924/0002* (2013.01); *Y10T 29/4913* (2015.01)

(58) Field of Classification Search
CPC combination set(s) only.
See application file for complete search history.

(56) References Cited

U.S. PATENT DOCUMENTS

| 5,342,167 | A  | * | 8/1994 | Rosseau ........................ 415/119 |
| 5,388,956 | A  | * | 2/1995 | Pla et al. ........................... 415/1 |
| 5,419,680 | A  | * | 5/1995 | Asano et al. .................. 415/119 |
| 6,375,416 | B1 | * | 4/2002 | Farrell et al. .................. 415/119 |
| 7,300,244 | B2 | * | 11/2007 | Baugh et al. .................. 415/119 |
| 2004/0114325 | A1 | | 6/2004 | Loftman et al. |

(Continued)

FOREIGN PATENT DOCUMENTS

JP   11-093670 A    4/1999
WO   2013137876 A1  9/2013

OTHER PUBLICATIONS

International Preliminary Report on Patentability and Written Opinion received for PCT Patent Application No. PCT/US2012/029139, mailed on Sep. 25, 2014, 6 pages.

(Continued)

*Primary Examiner* — Gregory Thompson
(74) *Attorney, Agent, or Firm* — Jordan IP Law, LLC

(57) ABSTRACT

Methods and systems may provide for a computing system including an electrical component, a heat exchanger coupled to the electrical component, and a fan having a rotor with a plurality of blades, one or more inlet sides and one or more outlet sides disposed adjacent to the heat exchanger. The computing system may also include an obstruction disposed adjacent to at least one of the one or more inlet sides of the fan, wherein a tone to be generated by the obstruction reduces a tonal noise associated with the fan during operation.

30 Claims, 3 Drawing Sheets

(56) References Cited

U.S. PATENT DOCUMENTS

| | | | |
|---|---|---|---|
| 2007/0077139 A1* | 4/2007 | Baugh et al. | 415/119 |
| 2008/0008592 A1* | 1/2008 | Gerard et al. | 416/203 |
| 2011/0064559 A1 | 3/2011 | Gerard et al. | |

OTHER PUBLICATIONS

Gerard, et al., "Automatic Positioning of Flow Obstructions to Control Tonal Fan Noise", Active 2009, Ottawa, Canada, Aug. 20-22, 2009, 12 pages.

Gerard, et al., "Tonal Noise Control from Centrifugal Fans Using Flow Control Obstructions", FAN 2012, Apr. 18-20, 2012, 9 pages.

Gerard, et al., "Experimental Validation of Tonal Noise Control from Subsonic Axial Fans Using Flow Control Obstructions", Journal of Sound and Vibration 321, Aug. 25, 2009, 18 pages.

Gerard, et al., "Modelling of Tonal Noise Control from Subsonic Axial Fans Using Flow Control Obstructions", Journal of Sound and Vibration 321, 26-44, 2009, 19 pages.

Gerard, et al., "Multi Modal Obstruction to Control Tonal Fan Noise : Theory and Experiments", 14th international symposium on Transport Phenomena and Dynamics of Rotating Machinery, ISROMAC-14, Feb. 27-Mar. 2, 2012, 10 pages.

Gerard, et al., "Passive Adaptive Control of Tonal Noise From Subsonic Axial Fans Using Flow Control Obstructions", Fan Noise 2007, Sep. 17-19, 2007, 12 pages.

Gerard, et al., "Psychoacoustic Impact of Tonal Noise Control From Fans", 2008, pp. 1-7.

International Search Report and Written Opinion received for PCT application No. PCT/US2012/029139, mailed on Nov. 28, 2012, 9 pages.

* cited by examiner

PASSIVE NOISE CANCELLATION FOR COMPUTER COOLING SYSTEMS

BACKGROUND

1. Technical Field

Embodiments generally relate to computer cooling systems. More particularly, embodiments relate to simple solutions to silencing cooling systems that are used in computers.

2. Discussion

Computing systems such as desktop computers and notebook computers may include heat generating components such as processors, wherein fans and other cooling solutions may be used to dissipate the generated heat during operation. While conventional cooling solutions may be suitable under certain circumstances, there remains considerable room for improvement. For example, the rotation of fan blades can generate audible noise in the computing system, particularly when the fan is in close proximity with circuit boards and other cooling solutions such as heat exchangers.

BRIEF DESCRIPTION OF THE DRAWINGS

The various advantages of the embodiments of the present invention will become apparent to one skilled in the art by reading the following specification and appended claims, and by referencing the following drawings, in which:

DETAILED DESCRIPTION

Embodiments may include a computing system having a circuit board with an electrical component, and a heat exchanger coupled to the electrical component. The computing system may also include a fan having a rotor with a plurality of blades, one or more inlet sides, and one or more outlet sides disposed adjacent to the heat exchanger. Additionally, the computing system can include an obstruction disposed adjacent to at least one of the one or more inlet sides of the fan, wherein a tone to be generated by the obstruction is to reduce a tonal noise associated with the fan.

Other embodiments may include for a method of fabricating a computing system, wherein the method may involve providing a circuit board including an electrical component, coupling a heat exchanger to the electrical component, and disposing one or more outlet sides of a fan adjacent to the heat exchanger. In one example, the fan further includes a rotor with a plurality of blades and one or more inlet sides, and the method involves disposing an obstruction adjacent to at least one of the one or more inlet sides of the fan. A tone to be generated by the obstruction may reduce a tonal noise associated with the fan.

Figure 1:
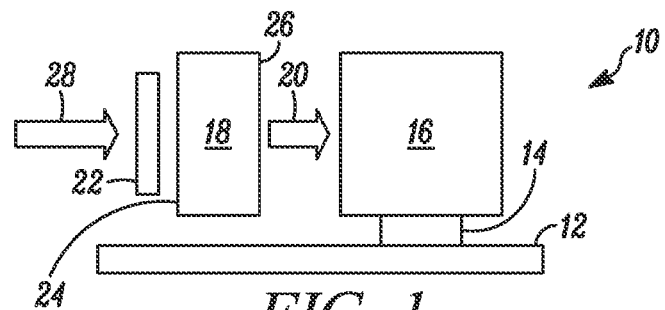
FIG. 1 is a block diagram of an example of a computing system according to an embodiment.

Turning now to FIG. 1, a computing system 10 is shown. The computing system 10 may be incorporated into a housing (not shown) having a desktop computer form factor, a notebook computer form factor, a smart tablet form factor, and so forth, wherein cooling the internal components and/or external housing of the computing system 10 may be advantageous. In the illustrated example, a circuit board 12 such as a motherboard has an electrical component 14 mounted thereon, wherein the electrical component may generate heat during operation. For example, the electrical component 14 might include a chipset device such as a processor, input/output (IO) controller, a memory controller, etc., a memory device, a network controller, a graphics controller, a voltage regulator, a disk drive device, and so forth. Accordingly, the computing system 10 may include a cooling solution having a heat exchanger 16 coupled, either directly or indirectly (e.g., via heat pipes, thermal interface material, etc.) to the electrical component 14, wherein a fan 18 can be used to direct airflow 20 from an outlet side 26 of the fan 18 across the heat exchanger 16. The airflow 20 may therefore facilitate the dissipation of heat collected by the heat exchanger 16 from the electrical component 14.

Of particular note is that the fan 18 may generate an audible tonal noise during operation, wherein the tonal noise can be a function of the interaction between the airflow 20 from the outlet side 26 of the fan and one or more vanes of the heat exchanger 16. For example, as each blade of the fan passes the vanes of the heat exchanger 16, sound pressures may be created by the resulting airflow 20. Thus, a "blade pass tone" might result from the cyclical rotations of the blades of the fan 18. As will be discussed in greater detail, the blade pass tone can have specific and predicable frequency content. In order to reduce the tonal noise associated with the fan 18, the illustrated computing solution 10 further includes an obstruction 22 disposed adjacent to (e.g., within approximately 0-1.0 inches of) an inlet side 24 of the fan 18. Thus, the obstruction 22 could be flush with or just outside the inlet plane. Indeed, the obstruction 22 could conceivably be within the inlet plane if the rotor is recessed within the fan housing (e.g., in the case of a centrifugal blower). The illustrated obstruction 22 shapes inlet airflow 28 and the outlet airflow 20 so that the tonal noise is minimized. In particular, the obstruction 22 may have an orientation and shape that cancels blade pass tonal noise.

Although the fan 18 is shown as having a single inlet side 24 and a single outlet side 26, other configurations may be used. For example, while axial fans may have a single inlet, centrifugal fans can have two natural inlets (although sometimes one is blocked and it is forced to function as a single inlet). Moreover, some centrifugal blowers have multiple outlets. In any case, the illustrated technology can be used for any combination of inlets and outlets.

Figure 2A:
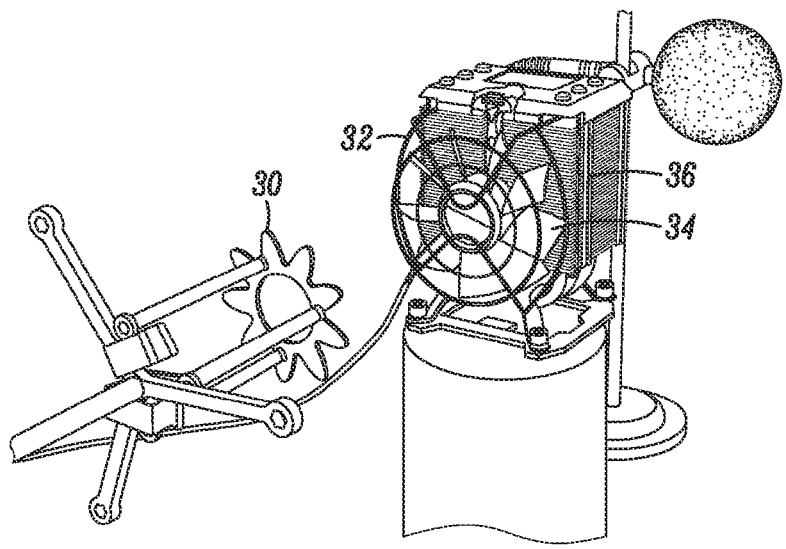
FIGS. 2A and 2B are perspective views of an example of a silencing solution before assembly and after assembly, respectively, according to an embodiment.
Figure 2B:
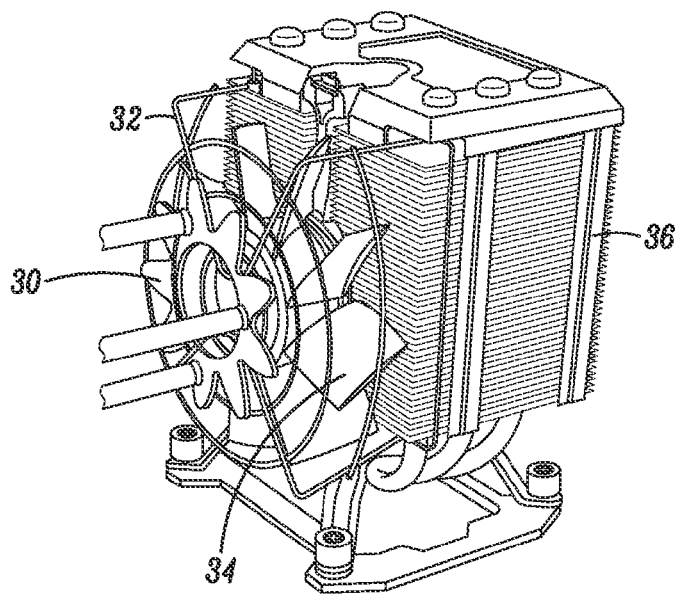

FIGS. 2A and 2B show a silencing solution before and after assembly, respectively. In the illustrated example, an obstruction 30 is coupled to a support structure such as, for example, a finger guard 32 that encloses a rotor with a plurality of blades 34 of a fan, wherein the fan has an outlet side disposed adjacent to a heat exchanger 36. The heat exchanger 36 can be thermally coupled to an electrical component (not shown) such as, for example, the electrical component 14 (FIG. 1), already discussed. The heat exchanger 36 may also be clamped to a circuit board (not shown) containing the electrical component. One example of such a circuit board is the circuit board 12 (FIG. 1), already discussed. The obstruction 30, which may be constructed of a lightweight plastic, metal and/or ceramic material, can be mounted in a substantially coplanar arrangement with respect to an inlet portion of the finger guard 32, so as to minimize height/clearance issues associated with computing system volume requirements.

The obstruction 30 may generally have a shape and orientation that reduces the tonal noise associated with the fan. More particularly, the illustrated obstruction 30 includes a disk geometry having an outer edge with a smooth lobed shape that generates an additional blade pass tone emission without significant harmonic content. Other geometries and profiles may also be used, as will be discussed in greater detail. Assembly of the silencing solution may involve orienting (e.g., azimuthally) the obstruction 30 so that it has a predefined phase and amplitude relationship with the blade pass tone of the fan. For example, if the tone generated by the obstruction is approximately one hundred eighty degrees out of phase with the blade pass tone, the audible noise associated with the cooling solution can be significantly canceled.

Figure 5:
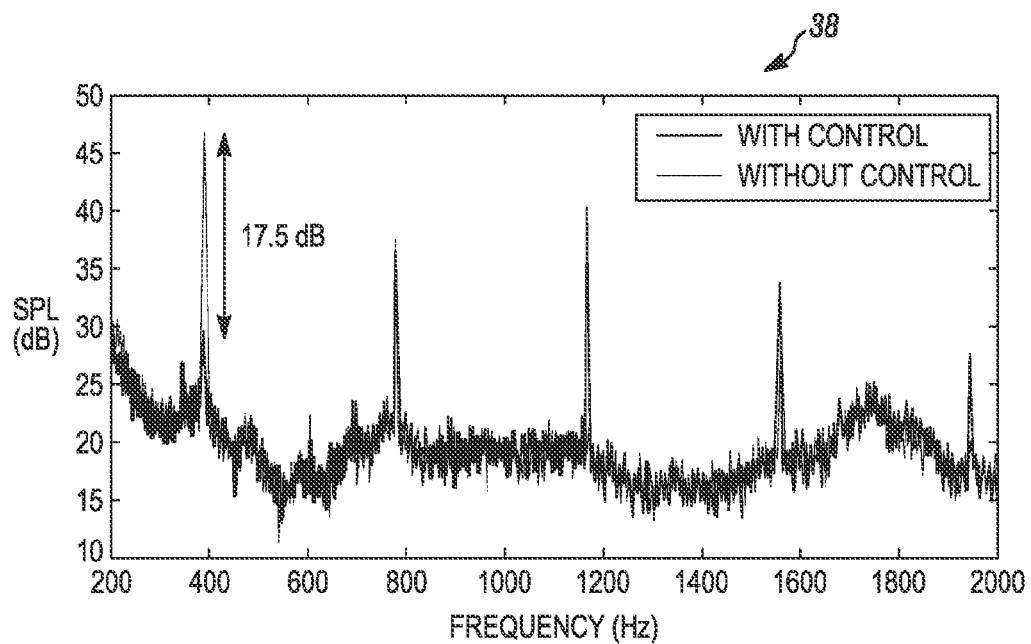
FIG. 5 is a plot of an example of a sound pressure measurement for a conventional cooling system and a cooling system according to an embodiment.

FIG. 5 shows a plot 38 of a sound pressure level measurement taken with an obstruction controlled cooling solution and without an obstruction controlled cooling solution. In the illustrated example, a 17.5 dB reduction was observed for the primary frequency of about 400 Hz, without adding noise elsewhere in the spectra. The illustrated improvement therefore represents a significant improvement over conventional computing system cooling systems. Other multi-frequency obstruction configurations may also be deployed to further reduce the tonal noise.

Figure 3:
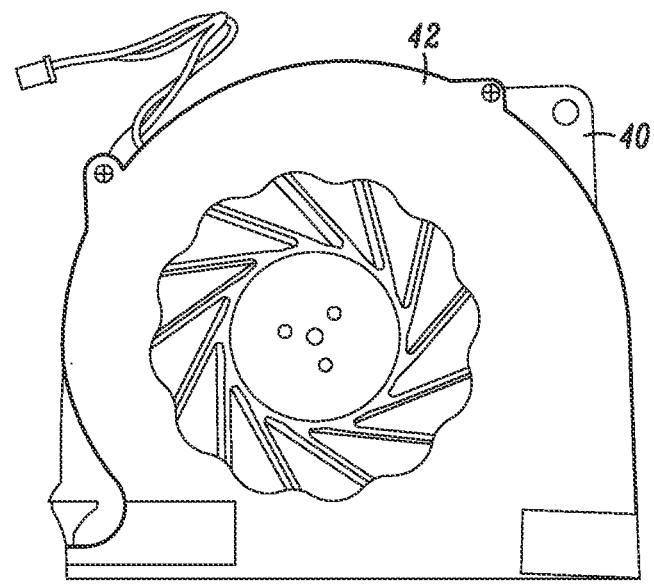
FIG. 3 is a plan view of an example of a notebook computer silencing solution having an obstruction with a ring geometry according to an embodiment.

Turning now to FIG. 3, an alternative silencing solution is shown. In the illustrated example, a centrifugal blower/fan 40 for a notebook computer is equipped with an obstruction 42 having a ring geometry with an inner edge that modifies airflow to an inlet side of the fan 40 during operation. The inner edge may have a smooth lobe profile as shown or other profile such as a multi-frequency profile. The illustrated obstruction 42 has been integrated into the fan enclosure.

Figure 4:
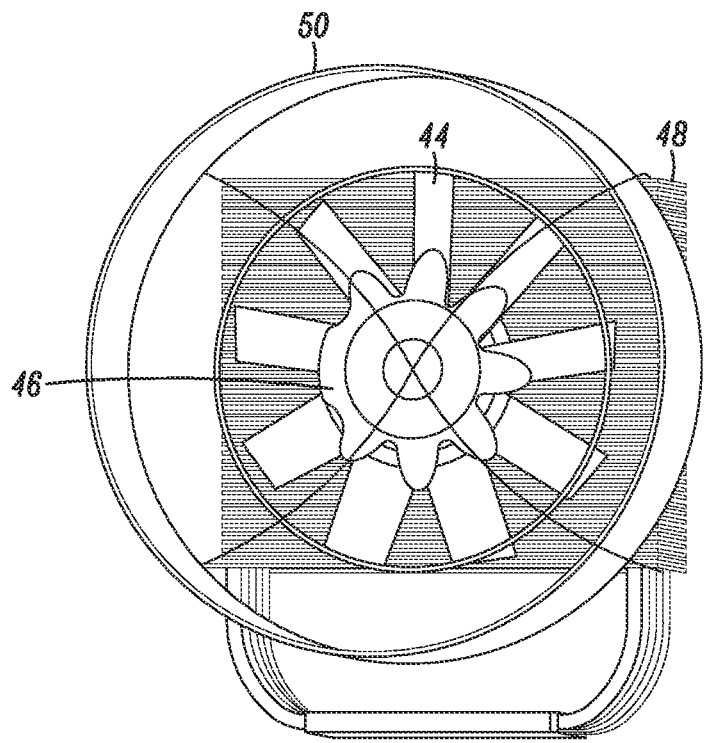
FIG. 4 is a perspective view of an example of a silencing solution having a shroud and an obstruction with a disk geometry and a multi-frequency outer edge according to an embodiment.

FIG. 4 shows another alternative silencing solution in which a fan 44 is disposed adjacent to a heat exchanger 48 of a computing system. The fan 44 may be equipped with an obstruction 46 having a disk geometry with an outer edge that modifies airflow to an inlet side of the fan 44 during operation. More particularly, the illustrated outer edge of the obstruction 46 has a multi-frequency profile that is capable of targeting more than a single blade pass tone. For example, the multi-frequency profile may enable a reduction of one or more harmonics or other frequencies that might contribute to the tonal noise of the fan 44. The illustrated silencing solution also includes a shroud 50 that encompasses a peripheral portion of the blades of the fan 50, wherein the shroud 50 may be used to further modify and/or redirect airflow in order to reduce audible noise. For example, the illustrated shroud 50 functions as a flow conditioner that might shield the silencing solution from airflow generated by other fans in the computing system.

Figure 6A:
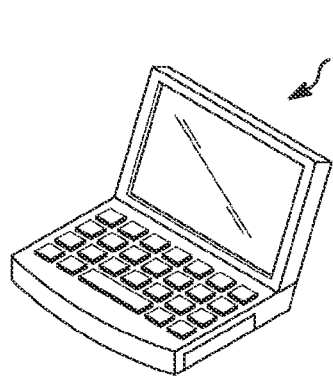
FIGS. 6A-6C are perspective views of examples of computing system form factors according to embodiments.
Figure 6B:
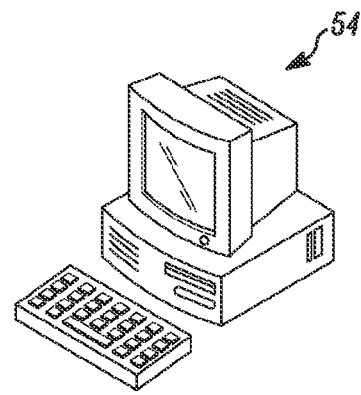
Figure 6C:
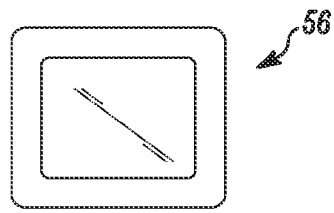

FIGS. 6A-6C show computing systems 52, 54 and 56 having various form factors that may take advantage of the low cost, lightweight silencing solutions described herein. In particular, the computing system 52 has a notebook computer form factor, the computing system 54 has a desktop computer form factor, and the computing system 56 has a smart tablet form factor. Other computing system arrangements may also be used.

Thus, techniques described herein may be used as an integrated part of extruded heat sinks, heat pipe-based heat sink, and other computing system heat sink solutions. The technology can significantly reduce the tonality of thermal solutions, leading to substantial improvements in sound quality, as well as potential improvements in overall sound power. Indeed, there may be a strong correlation of sound quality metrics, such as tonality, in perceived annoyance of fan noise. Simply put, techniques described herein can make computing system fan noise less annoying, and may therefore improve the user experience.

Certain aspects of embodiments of the present invention may be implemented using hardware, software, or a combination thereof and may be implemented in one or more computer systems or other processing systems. Program code may be applied to the data entered using an input device to perform the functions described and to generate output information. The output information may be applied to one or more output devices. One of ordinary skill in the art may appreciate that embodiments may be practiced with various computer system configurations, including multiprocessor systems, minicomputers, mainframe computers, and the like. Embodiments may also be practiced in distributed computing environments where tasks may be performed by remote processing devices that are linked through a communications network.

Each program may be implemented in a high level procedural or object oriented programming language to communicate with a processing system. However, programs may be implemented in assembly or machine language, if desired. In any case, the language may be functional, compiled or interpreted.

Program instructions may be used to cause a general-purpose or special-purpose processing system that is programmed with the instructions to perform the methods described herein. Alternatively, the methods may be performed by specific hardware components that contain hardwired logic for performing the methods, or by any combination of programmed computer components and custom hardware components. The methods described herein may be provided as a computer program product that may include at least one machine readable medium having stored thereon instructions that may be used to program a processing system or other electronic device to perform the methods. The term "machine readable medium" or "machine accessible medium" used herein shall include any medium that is capable of storing or encoding a sequence of instructions for execution by the machine and that causes the machine to perform any one of the methods described herein. The terms "machine readable medium" and "machine accessible medium" may accordingly include, but not be limited to, solid-state memories, optical and magnetic disks, and a carrier wave that encodes a data signal. Furthermore, it is common in the art to speak of software, in one form or another (e.g., program, procedure, process, application, module, logic, and so on) as taking an action or causing a result. Such expressions are merely a shorthand way of stating the execution of the software by a processing system to cause the processor to perform an action or produce a result.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

While various embodiments of the present invention have been described above, it should be understood that they have been presented by way of example only, and not limitation. It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined in accordance with the following claims and their equivalents.

We claim:

1. A computing system comprising:
   a circuit board including an electrical component;
   a heat exchanger coupled to the electrical component;
   a fan including a rotor with a plurality of blades, one or more inlet sides and one or more outlet sides disposed adjacent to the heat exchanger; and
   an obstruction disposed adjacent to at least one of the one or more inlet sides of the fan,
   wherein a tone to be generated by the obstruction is to reduce a tonal noise associated with the fan, and wherein the heat exchanger is clamped to the circuit board.

2. The computing system of claim 1, wherein the tone to be generated by the obstruction is to have a predefined phase and amplitude relationship with a blade pass tone of the fan.

3. The computing system of claim 2, wherein the obstruction has one or more of a shape, an orientation and a proximity with respect to the fan that provides the predefined phase and amplitude relationship.

4. The computing system of claim 2, wherein the heat exchanger includes a plurality of vanes, and wherein the blade pass tone is to be a function of airflow from at least one of the one or more outlet sides of the fan interacting with the plurality of vanes.

5. The computing system of claim 1, wherein a shape of the obstruction includes a disk geometry with an outer edge that is to modify airflow to at least one of the one or more inlet sides of the fan.

6. The computing system of claim 5, wherein the outer edge has one or more of a smooth lobe profile and a multi-frequency profile.

7. The computing system of claim 1, wherein a shape of the obstruction includes a ring geometry with an inner edge that is to modify airflow to at least one of the one or more inlet sides of the fan.

8. The computing system of claim 7, wherein the inner edge has one or more of a smooth lobe profile and a multi-frequency profile.

9. The computing system of claim 1, further including a support structure enclosing the plurality of blades, wherein the obstruction is coupled to an inlet portion of the support structure.

10. The computing system of claim 9, wherein the obstruction is substantially coplanar with the inlet portion of the support structure.

11. The computing system of claim 1, wherein the obstruction includes one or more of a plastic material, a metal material and a ceramic material.

12. The computing system of claim 1, further including a shroud that encompasses a peripheral portion of the plurality of blades.

13. The computing system of claim 1, further including a housing that encloses the computing system, wherein the housing has a desktop computer form factor.

14. The computing system of claim 1, further including a housing that encloses the computing system, wherein the housing has a notebook computer form factor.

15. The computing system of claim 1, further including a housing that encloses the computing system, wherein the housing has a smart tablet form factor.

16. A method of fabricating a computing system comprising:
   providing a circuit board including an electrical component;
   coupling a heat exchanger to the electrical component;
   disposing one or more outlet sides of a fan adjacent to the heat exchanger, wherein the fan further includes a rotor with a plurality of blades and one or more inlet sides; and
   disposing an obstruction adjacent to at least one of the one or more inlet sides of the fan,
   wherein a tone to be generated by the obstruction is to reduce a tonal noise associated with the fan, and wherein the heat exchanger is clamped to the circuit board.

17. The method of claim 16, further including configuring the tone to be generated by the obstruction so that it has a predefined phase and amplitude relationship with a blade pass tone of the fan.

18. The method of claim 17, wherein configuring the tone to be generated by the obstruction includes configuring one or more of a shape of the obstruction, an orientation of the obstruction and a proximity of the obstruction with respect to the fan.

19. The method of claim 17, further including providing the heat exchanger with a plurality of vanes, wherein the blade pass tone is a function of airflow from at least one of the one or more outlet sides of the fan interacting with the plurality of vanes.

20. The method of claim 16, further including providing a shape of the obstruction with a disk geometry having an outer edge that modifies airflow to at least one of the one or more inlet sides of the fan.

21. The method of claim 20, further including providing the outer edge with one or more of a smooth lobe profile and a multi-frequency profile.

22. The method of claim 16, further including providing a shape of the obstruction with a ring geometry having an inner edge that modifies airflow to at least one of the one or more inlet sides of the fan.

23. The method of claim 22, further including providing the inner edge with one or more of a smooth lobe profile and a multi-frequency profile.

24. The method of claim 16, further including enclosing the plurality of blades of the fan with a support structure, wherein the obstruction is coupled to an inlet portion of the support structure.

25. The method of claim 24, further including arranging the obstruction so that it is substantially planar with the inlet portion of the support structure.

26. The method of claim 16, further including forming the obstruction from one or more of a plastic material, a metal material and a ceramic material.

27. The method of claim 16, further including encompassing a peripheral portion of the plurality of blades with a shroud.

28. The method of claim 16, further including enclosing the computing system with a housing having a desktop computer form factor.

29. The method of claim 16, further including enclosing the computing system with a housing having a notebook computer form factor.

30. The method of claim 16, further including enclosing the computing system with a housing having a smart tablet form factor.

* * * * *